United States Patent
Takagi et al.

(10) Patent No.: US 6,875,698 B2
(45) Date of Patent: Apr. 5, 2005

(54) DRY ETCHING METHOD

(75) Inventors: Kiyohiko Takagi, Osaka (JP); Teiichi Kimura, Itami (JP); Yoshihiro Yanagi, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 142 days.

(21) Appl. No.: 09/892,023

(22) Filed: Jun. 26, 2001

(65) Prior Publication Data
US 2001/0055886 A1 Dec. 27, 2001

(30) Foreign Application Priority Data
Jun. 26, 2000 (JP) .................................. 2000-190716

(51) Int. Cl.$^7$ .................................................. H01L 21/302
(52) U.S. Cl. ........................................ 438/706; 438/730
(58) Field of Search ................................ 438/706, 730, 438/688

(56) References Cited

U.S. PATENT DOCUMENTS

| | | | | |
|---|---|---|---|---|
| 4,478,677 A | * | 10/1984 | Chen et al. | 216/65 |
| 5,445,710 A | * | 8/1995 | Hori et al. | 216/41 |
| 5,883,007 A | * | 3/1999 | Abraham et al. | 438/714 |
| 5,939,831 A | * | 8/1999 | Fong et al. | 134/1.1 |
| 5,952,244 A | * | 9/1999 | Abraham et al. | 438/714 |
| 6,097,094 A | * | 8/2000 | Ishigami | 257/763 |

* cited by examiner

Primary Examiner—W. David Coleman
(74) Attorney, Agent, or Firm—Jordan and Hamburg LLP

(57) ABSTRACT

In dry etching process wherein a substrate having a multi-layer film is etched, the etching process is monitored by determining a layer being processed. $CHF_3$ gas is added to the processing gas during a period from the time when the lowermost layer on the substrate is etched until the etching is completed.

21 Claims, 2 Drawing Sheets

~A: Titanium etching
A~B: Titanium/Aluminum etching
B~C: Aluminum etching
C~D: Aluminum/Titanium etching
D~E: Titanium etching
E~F: Titanium/a-Si etching
F~G: Discharge Off
G~H: a-Si etching with $CHF_3$ gas added ~A: Titanium etching
A~B: Titanium/Aluminum etching
B~C: Aluminum etching
C~D: Aluminum/Titanium etching
D~E: Titanium etching
E~F: Titanium/a-Si etching
F~G: Discharge Off
G~H: a-Si etching with $CHF_3$ gas added

DRY ETCHING METHOD

BACKGROUND OF THE INVENTION

The present invention relates to a dry etching method used for the manufacture of electronic devices, and more particularly to a treatment of stacked thin metal films.

Dry etching involves supplying processing gas into a vacuum chamber while the chamber is evacuated so as to control the pressure therein to a predetermined level, and applying RF power to a plasma source and/or to an electrode within the vacuum chamber, thereby generating plasma in the chamber for desired processing of a substrate placed upon the electrode within the vacuum chamber.

When subjecting a plurality of stacked thin films of various different materials having different characteristics to such process, it is imperative for achieving desired etch shapes to prevent etching from proceeding crosswise into the plurality of films.

In order to prevent crosswise etching, it is desirable to increase physical effects obtained by ions rather than chemical effects of active radicals for enhancing the linearity of etching. Various attempts have been made for that purpose, such as lowering the pressure within the vacuum chamber, increasing a bias voltage to be applied, or adding a deposition gas to provide a protective film on the side walls of the etch shape.

However, lowering of pressure during the etching process or increasing of bias power may cause damages to the substrate or to the underlying layer. Use of deposition gas can be ineffective depending on the type of gas or the added amount, and it may also induce an etch stop.

Moreover, the interaction of the deposition gas with the layers to be etched on the substrate may produce a reactive substance, causing defects such as opaque spots formed on the substrate.

SUMMARY OF THE INVENTION

The present invention has been devised in light of the above-described problems encountered by the prior art, and it is an object of the invention to provide a dry etching method, with which the type of deposition gas, and the rate and the timing of addition thereof are optimized for achieving favorable etching results, whereby local crosswise etching of etch shapes and opaque spots on processed substrates are eliminated.

A dry etching process according to the present invention includes:

introducing a processing gas into a vacuum chamber to achieve a predetermined controlled pressure level therein;

applying RF power to a substrate placed within the vacuum chamber for generating plasma in the vacuum chamber, whereby; the substrate is processed, the substrate having a plurality of stacked layers including metal layers;

etching the layers on the substrate with the processing gas until a time point when the surface of a lowermost layer on the substrate is etched; and adding $CHF_3$ gas to the processing gas for etching the lowermost layer of the substrate.

If the substrate includes a layer of aluminum, the $CHF_3$ gas is added only after the aluminum layer has been etched away. Thereby, formation of opaque spots on the substrate by the interaction of $CHF_3$ gas with the layers to be etched is prevented.

The $CHF_3$ gas is added preferably in a proportion of 15 to 40% with respect to the total flow rate of the processing gas. Thereby, an etch stop, a drop in the etching rate, and opaque-spot defects caused by excessive rate of $CHF_3$ gas are prevented.

The processing gas is preferably one of $Cl_2$ and a gaseous mixture containing $Cl_2$.

These and other objects and characteristics of the present invention will become further clear from the following description with reference to the accompanying drawings.

DETAILED DESCRIPTION OF THE PREFERRED EMBODIMENTS

Preferred embodiments of the present invention will be hereinafter described with reference to the accompanying drawings.

Figure 1:
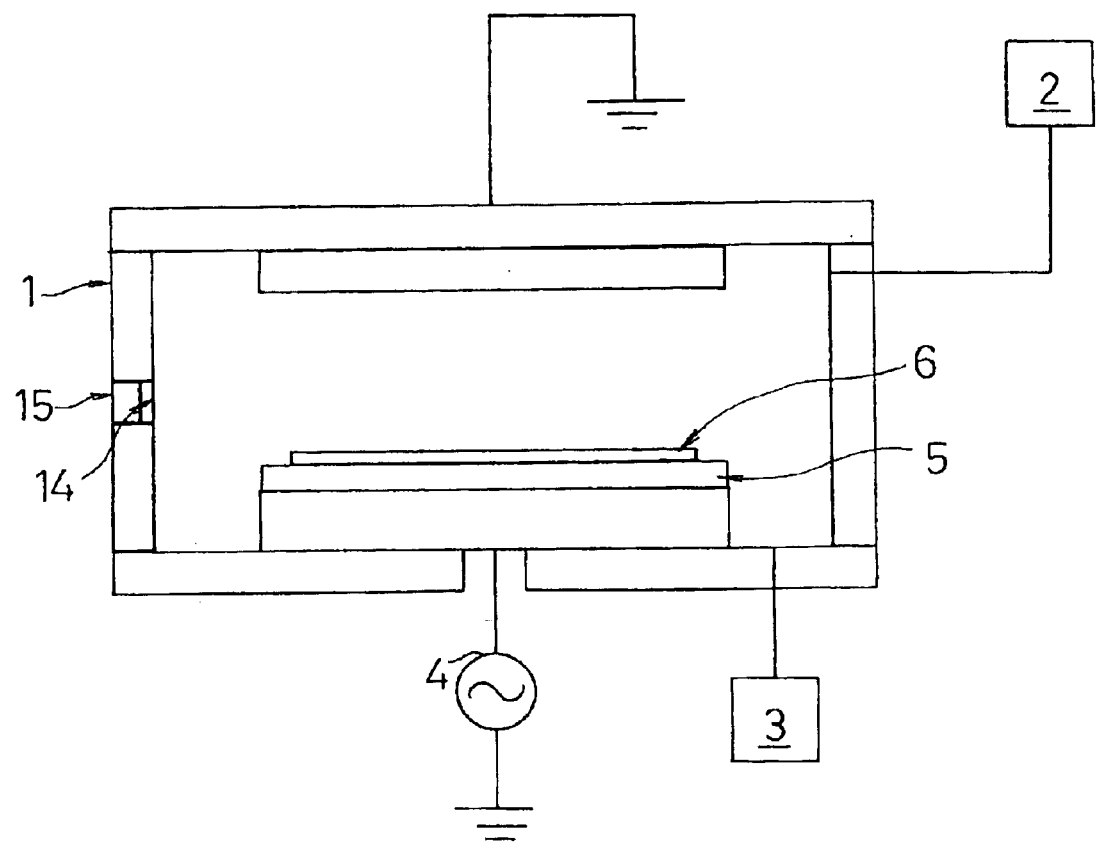
FIG. 1 is a schematic diagram illustrating the construction of a plasma processing apparatus for implementing a dry etching method according to one embodiment of the present invention.

Referring to FIG. 1, a vacuum chamber 1 is equipped with a gas supply system 2 and a vacuum pump 3 serving as an evacuation system. A substrate 6 to be subjected to etching is placed upon a lower electrode 5 within the vacuum chamber 1. The lower electrode 5 is connected to an RF power source 4. An optical filter 14 is provided to a window formed in a side wall of the vacuum chamber 1. In the side wall is also provided a photo-diode 15 for detecting plasma light intensity within the vacuum chamber 1 through the optical filter 14.

For performing etching, while a predetermined amount of processing gas is supplied into the vacuum chamber 1 by the gas supply system 2, the vacuum chamber 1 is evacuated by the vacuum pump 3 so as to adjust the pressure inside of the vacuum chamber 1 to a predetermined level. RF power is applied to the lower electrode 5 from the RF power source 4, whereupon plasma is generated in the vacuum chamber 1 and the substrate. 6 on the lower electrode 5 is etched. The intensity of plasma light at this time is detected by the photo-diode 15 through the optical filter 14, which passes light having a predetermined wavelength, to monitor the etching process.

Specific examples of embodiment of the method of etching according to the invention will be described below.

EXAMPLE 1

Gaseous mixture containing $Cl_2$ and $BCl_3$ was supplied at a predetermined flow rate into the vacuum chamber 1, while evacuating the vacuum chamber 1 to adjust the pressure therein to 15 mTorr. RF power was applied to the lower electrode 5 from the RF power source 4, for generating plasma in the vacuum chamber 1 to etch the substrate 6 on the lower electrode 5.

The substrate 6 had a multilayer structure including layers of 1000 angstrom thick titanium, 1800 angstrom thick aluminum, 800 angstrom titanium, and glass. The etching process was monitored by detecting plasma light intensity with the photo-diode 15 using the optical filter 14 for passing light having a wavelength of 396 nm. At the point when it was ascertained that the aluminum layer had been etched away, $CHF_3$ gas was added as a deposition gas, wherein the proportion of CHF₃ gas is about 35% with respect to the total flow rate of the processing gas, from the time point when the lowermost titanium layer was etched until the etching was completed.

According to the above-described etching method, no crosswise etching into the etch shape was observed, nor any opaque spots were found on the resultant substrate 6.

However, when the proportion of CHF₃ gas added as a deposition gas was 40% or more with respect to the total flow rate of the processing gas under the identical circumstance to the above-described etching method, the experimentation resulted with an etch stop on the substrate.

EXAMPLE 2

Gaseous mixture containing Cl₂ and BCl₃ was supplied at a predetermined flow rate into the vacuum chamber 1, while evacuating the vacuum chamber 1 to adjust the pressure therein to 15 mTorr to 50 mTorr. RF power was applied to the lower electrode 5 from the RF power source 4, for generating plasma in the vacuum chamber 1 to etch the substrate 6 on the lower electrode 5.

The substrate 6 had a multilayer structure including layers of 1000 angstrom thick titanium, 1800 angstrom thick aluminum, 800 angstrom titanium, 3600 angstrom thick a-Si, and glass. The etching process was monitored by detecting plasma light intensity with the photo-diode 15 using the optical filter 14 for passing light having a wavelength of 396 nm. At the point when it was ascertained that the lower titanium layer had been etched away, CHF₃ gas was added as a deposition gas gas from the time point when the lowermost a-Si layer was, etched until the etching was completed.

Figure 2:
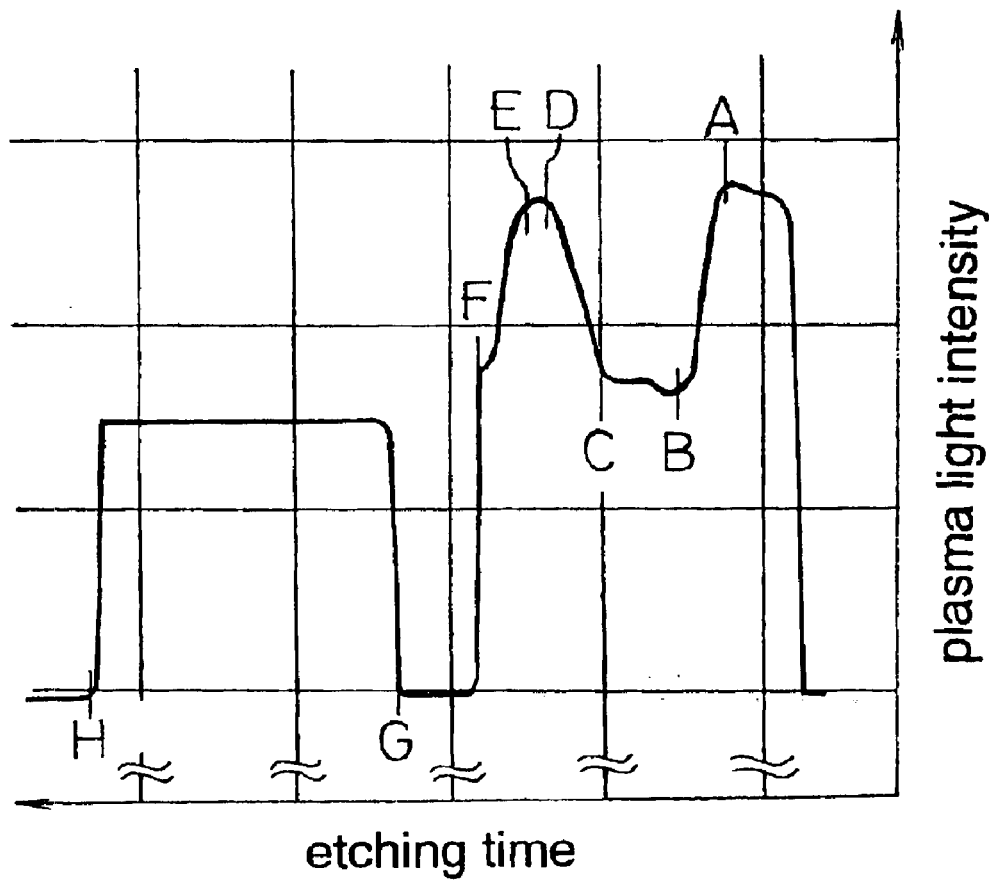
FIG. 2 is a graph showing the profile of plasma light intensity in one embodiment of the invention.

FIG. 2 shows the profile of plasma light intensity with respect to the etching process time observed in this example. CHF₃ gas was added in a proportion of 10% with respect to the total flow rate of the processing gas during the period from G to H in FIG. 2.

In this specific example, the discharge is stopped shortly before adding CHF₃ gas, but it may be continued.

According to the above-described etching method, no crosswise etching into the etch shape was observed, nor any opaque spots were found on the resultant substrate 6.

Also, a further experimentation resulted with less crosswise etching into the etch shape observed when the proportion of CHF₃ gas was 10% or less with respect to the total flow rate of the processing gas, and better result was observed when the proportion of CHF₃ gas was from 5 to 10% of the total flow rate of the processing gas.

In the above-described embodiments, detection of plasma light intensity through an optical filter for passing light having a predetermined wavelength was used for monitoring etching process, however, various methods for monitoring etching process can be implemented by detection of, for example, electric potential of plasma, plasma impedance, ion flux and mass analysis. Also, it is possible to determine when to supply CHF₃ gas by obtaining a sample data respect to the progression and the time period of the etching process instead of the above-described monitoring methods.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A dry etching process including:

providing a substrate having a plurality of stacked layers including metal layers a base of glass;

introducing a processing gas into a vacuum chamber to achieve a predetermined controlled pressure level therein, the processing gas being one of Cl₂ and a gaseous mixture containing Cl₂, CHF₃ being substantially absent from said processing gas;

applying radio frequency power to a substrate placed within the vacuum chamber for generating plasma in the vacuum chamber, whereby the substrate is processed;

etching the layers on the substrate with the processing gas until a time point when the surface of a lowermost layer on the substrate is etched; and adding CHF₃ gas to the processing gas for etching the lowermost layer on the substrate.

2. The dry etching process according to claim 1, wherein the etching process is effected through a method of determining a layer being processed.

3. The dry etching process according to claim 1, wherein the lowermost layer on the substrate is the subject to be etched.

4. The dry etching process according to claim 2, wherein the method of determining is monitoring the etching process by detecting plasma light intensity.

5. The dry etching process according to claim 4, wherein a non-aluminum reactive gas is added when the substrate includes a layer of aluminum.

6. The dry etching process according to claim 5, wherein the proportion of CHF₃ gas is 40% or less with respect to the total flow rate of the processing gas.

7. The dry etching process according to claim 5, wherein the proportion of CHF₃ gas is between 5% and 40% with respect to the total flow rate of the processing gas.

8. The dry etching process according to claim 5, wherein the proportion of CHF₃ gas is 15% or less with respect to the total flow rate of the processing gas.

9. The dry etching process according to claim 5, wherein the proportion of CHF₃ gas is between 5% to 15% with respect to the total flow rate of the processing gas.

10. The dry etching process according to claim 5, wherein the proportion of CHF₃ gas is between 15% to 40% with respect to the total flow rate of the processing gas.

11. The dry etching process according to one of claims 6–10, wherein the lowermost layer on the substrate includes titanium.

12. The dry etching process according to one of claims 6–10, wherein the metal layers of the plurality of stacked layers comprise an aluminummiddle layer and titanium top and bottom layers.

13. The dry etching process according to claim 2, wherein the method of determining is based upon the sampling data obtained from the experimentation.

14. The dry etching process according to claim 13, wherein a non-aluminum reactive gas is added when the substrate includes a layer of aluminum.

15. The dry etching process according to claim 14, wherein the proportion of CHF₃ gas is 40% or less with respect to the total flow rate of the processing gas.

16. The dry etching process according to claim 14, wherein the proportion of CHF₃ gas is between 5% and 40% with respect to the total flow rate of the processing gas.

17. The dry etching process according to claim 14, wherein the proportion of $CHF_3$ gas is 15% or less with respect to the total flow rate of the processing gas.

18. The dry etching process according to claim 14, wherein the proportion of $CHF_3$ gas is between 5% and 15% with respect to the total flow rate of the processing gas.

19. The dry etching process according to claim 14, wherein the proportion of $CHF_3$ gas is between 15% and 40% with respect to the total flow rate of the processing gas.

20. The dry etching process according to one of claims 15–19, wherein the lowermost layer on the substrate includes titanium.

21. The dry etching process according to one of claims 15–19, wherein the metal layers of the plurality of stacked layers comprise an aluminum middle layer and titanium top and bottom layers.

* * * * *